United States Patent
Reynolds et al.

(10) Patent No.: US 7,825,741 B2
(45) Date of Patent: Nov. 2, 2010

(54) FREQUENCY MULTIPLIERS USING MULTI-PHASE OSCILLATION

(75) Inventors: Scott Kevin Reynolds, Amawalk, NY (US); Mehmet Soyuer, Stamford, CT (US); Chinmaya Mishra, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 12/127,389

(22) Filed: May 27, 2008

(65) Prior Publication Data
US 2009/0051394 A1    Feb. 26, 2009

Related U.S. Application Data

(60) Provisional application No. 60/949,685, filed on Jul. 13, 2007.

(51) Int. Cl.
*H03K 3/03* (2006.01)
(52) U.S. Cl. .......... 331/57; 331/135; 331/137; 327/113; 327/119; 327/230; 327/231; 327/234; 327/235
(58) Field of Classification Search .......... 331/57, 331/135, 137; 327/113, 119, 230, 231, 234, 327/235
See application file for complete search history.

(56) References Cited

U.S. PATENT DOCUMENTS

| | | | | |
|---|---|---|---|---|
| 6,094,103 | A * | 7/2000 | Jeong et al. | 331/57 |
| 6,664,824 | B2 * | 12/2003 | Laws | 327/122 |
| 6,900,699 | B1 * | 5/2005 | Kim | 331/46 |
| 2001/0005151 | A1 * | 6/2001 | Suematsu et al. | 327/65 |
| 2003/0128773 | A1 | 7/2003 | Cargill et al. | |
| 2004/0156418 | A1 * | 8/2004 | Debord et al. | 374/103 |
| 2007/0126500 | A1 * | 6/2007 | Mattisson et al. | 330/10 |
| 2008/0169859 | A1 * | 7/2008 | Garcia et al. | 327/355 |

OTHER PUBLICATIONS

B. Floyd et al., "A Silicon 60GHz Receiver and Transmitter Chipset for Broadband Communications," IEEE International Solid-State Circuits Conference (ISSCC 2006), Session 10.3, Feb. 2006, pp. 649-658.

(Continued)

*Primary Examiner*—Arnold Kinkead
*Assistant Examiner*—Richard Tan
(74) *Attorney, Agent, or Firm*—Anne Dougherty; Ryan, Mason & Lewis, LLP

(57) ABSTRACT

A method of generating an output signal from an input signal includes a step of generating a set of n signals, n being an integer greater than or equal to 3, by generating a signal for each integer i such that $0 \leq i \leq (n-1)$, each signal within the set having the same frequency and approximately equal amplitude and a phase equal to $(360/n)i$ degrees. The method also includes a step of inputting each of the set of n signals to a gate terminal of a corresponding one of a set of n transistors. Each of the transistors has a source terminal electrically connected to a common voltage drain and each of the transistors has a drain terminal electrically connected to a coupling. The coupling is electrically connected to a common voltage source. The output signal at the coupling has a frequency equal to the frequency of the input signal multiplied by n.

20 Claims, 6 Drawing Sheets

OTHER PUBLICATIONS

B. Floyd et al., "SiGe Bipolar Transceiver Circuits Operating at 60 GHz," IEEE Journal of Solid-State Circuits, Jan. 2005, pp. 156-167, vol. 40, No. 1.

S. Verma et al., "A Multiply-by-3 Coupled-Ring Oscillator for Low-Power Frequency Synthesis," IEEE Journal of Solid-State Circuits, Apr. 2004, pp. 709-713, vol. 39, No. 4.

* cited by examiner

FREQUENCY MULTIPLIERS USING MULTI-PHASE OSCILLATION

CROSS-REFERENCE TO RELATED APPLICATION

This application claims the benefit of U.S. Provisional Application No. 60/949,685, filed Jul. 13, 2007, the disclosure of which is incorporated by reference herein.

STATEMENT REGARDING FEDERALLY SPONSORED RESEARCH OR DEVELOPMENT

The invention disclosed herein was made with U.S. Government support under Contract Nos. N66001-02-C-8014 and N66001-05-C-8013 awarded by the Defense Advanced Research Projects Agency (DARPA). The Government has certain rights in this invention.

FIELD OF THE INVENTION

The invention relates to the design and implementation of frequency multipliers, and more specifically to the design and implementation of frequency amplifiers based on multi-phase oscillators.

BACKGROUND OF THE INVENTION

The use of mainstream CMOS (complimentary metal-oxide semiconductor) technology for millimeter wave applications is gaining attention primarily due to its low cost. However, at millimeter wave frequencies, conventional schemes for generation of a local oscillator (LO) signal are not practical due to the very high frequency operation. Achieving good tuning range, phase noise and precise quadrature signals at millimeter wave frequencies, (e.g. 60 GHz) is not easy. Besides, the available power from a CMOS device is very low at such frequencies.

Hence, it is advantageous to have the LO source operating at a lower frequency (preferably a sub-harmonic of the required LO frequency to down convert the RF signal) because of ease of implementation, availability of better well characterized passives and better phase noise and tuning range with less susceptibility to parasitics. Such a LO source could be followed by a frequency multiplier to drive the mixer in the receive and transmit chain. Frequency multiplication also translates a small tuning range at a lower frequency to a larger tuning range at a higher frequency on an absolute scale although the relative tuning rage with respect to that of the center of the band is constant.

There are different ways of implementing a frequency multiplier. For example, a frequency multiplier may be implemented using a single FET device and terminating its terminals at unwanted harmonic components. Other frequency multipliers have been implemented either using diodes (varactors, step recovery diodes and Schottky-barrier diodes) or active devices. While passive resistive diode multipliers are broadband and inefficient, and varactors are narrowband and efficient, active multipliers can have broad bandwidths and conversion gain. The DC power advantage of active multipliers is essential for RF and wireless applications. In an active multiplier, the key to efficient operation is the prevent loss of power at any other harmonic other than the harmonic of interest.

SUMMARY OF THE INVENTION

An illustrative embodiment of the present invention includes a method of generating an output signal from an input signal. The method includes a step of generating a set of n signals, n being an integer greater than or equal to 3, by generating a signal for each integer i such that $0 \leq i \leq (n-1)$, each signal within the set having the same frequency and approximately equal amplitude and a phase equal to $(360/n)i$ degrees. The method also includes a step of inputting each of the set of n signals to a gate terminal of a corresponding one of a set of n transistors. Each of the transistors has a source terminal electrically connected to a common voltage drain and each of the transistors has a drain terminal electrically connected to a coupling. The coupling is electrically connected to a common voltage source. The output signal at the coupling has a frequency equal to the frequency of the input signal multiplied by n.

Another illustrative embodiment of the present invention includes a method of generating a differential output from an input signal. The method includes a step of generating a first set of n signals, n being an integer greater than or equal to 3, by generating a signal for each integer i such that $0 \leq i \leq (n-1)$, each signal within the first set of signals having a frequency and amplitude equal to the input signal and a phase equal to $(360/n)i$ degrees. The method also includes a step of inputting each of the first set of n signals to a gate terminal of a corresponding one of a first set of n transistors. Each of the transistors within the first set of transistors has a source terminal electrically connected to a common voltage drain and each of the transistors within the first set of transistors has a drain terminal electrically connected to a first coupling. The first coupling is electrically connected to a common voltage source.

The method also includes a step of generating a second set of n signals by generating a signal for each integer j such that $0 \leq j \leq (n-1)$, each signal within the second set of signals having a frequency and amplitude equal to the input signal and a phase equal to $(360/n)j + (360/2n)$ degrees. The method also includes a step of inputting each of the second set of n signals to a gate terminal of a corresponding one of a second set of n transistors. Each of the transistors within the second set of transistors has a source terminal electrically connected to a common voltage drain and each of the transistors within the second set of transistors has a drain terminal electrically connected to a second coupling. The second coupling is electrically connected to a common voltage source. The differential output signals at the first and second couplings each have a frequency equal to the frequency of the input signal multiplied by n.

A further illustrative embodiment of the present invention includes a frequency multiplier comprising a first set of n transistors, where n is an integer such that $n \geq 3$. The frequency multiplier also includes a first coupling electrically connected to a drain terminal of each of the at least first set of transistors; a voltage source electrically connected to the first coupling; and a voltage drain electrically connected to a source terminal of each of the first set of transistors. Respective gate terminals of the first set of n transistors are operative to receive corresponding ones of a first set of n signals having a given frequency and a given amplitude but with phases separated by $360/n$ degrees, thereby producing a signal at the at least first coupling with a frequency equal to the common frequency multiplied by n. The frequency multiplier may also include a second set of n transistors, each transistor having a source terminal electrically connected to the voltage drain; and a second coupling electrically connected to the voltage source and to a drain terminal of each of the at least first set of transistors; wherein respective gate terminals of the second set of n transistors are operative to receive corresponding ones of a second set of n signals having the given frequency and the given amplitude but with phases separated by 360/n degrees, thereby producing a signal at the second coupling with a frequency equal to the given frequency multiplied by n.

These and other objects, features and advantages of the present invention will become apparent from the following detailed description of illustrative embodiments thereof, which is to be read in connection with the accompanying drawings.

DETAILED DESCRIPTION

Although illustrative embodiments of the present invention may be particularly well-suited for use in a high-frequency and/or millimeter-wave receiver or transceiver, illustrative embodiments of the present invention may be used in a variety of contexts, including a broad range of communications, radar, and radiometry applications.

Although the embodiments described herein are implemented using n-channel metal-oxide-semiconductor field-effect transistors (MOSFETs), alternative embodiments of the present invention may be implemented using other active devices, including but not limited to p-channel MOSFETs, bipolar transistors (BJTs), metal epitaxial semiconductor field effect transistors (MESFETs), junction field-effect transistors (JFETs), high electron mobility transistors (HEMTs), and/or vacuum tubes.

It is therefore to be understood that the techniques of the present invention are not limited to the methods and apparatus shown and described herein. Rather, alternative methods and apparatus within the scope of this invention will become apparent to those skilled in the art given the teachings herein.

Figure 1:
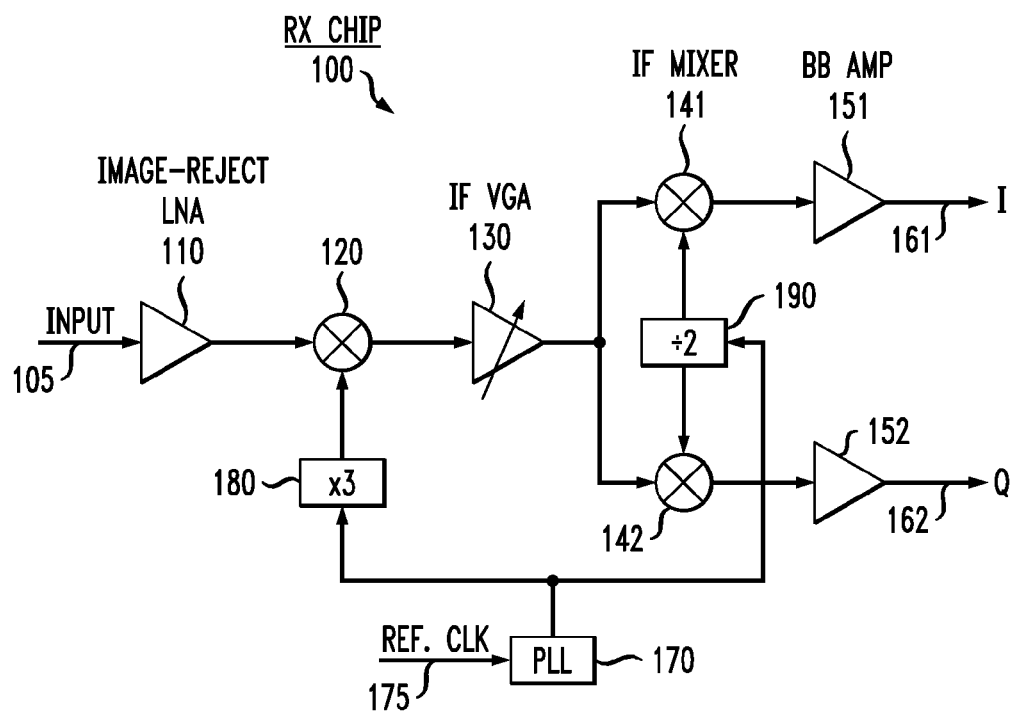
FIG. 1 shows a block diagram of a 60 GHz radio receiver suitable for use with an illustrative embodiment of the present invention.

FIG. 1 is a block diagram of 60 GHz radio receiver 110. Input signal 105 is passed through image-reject low-noise amplifier (LNA) 110. Mixer 120 receives a first local oscillator signal from frequency tripler 180, to be discussed in further detail hereinafter. After going through intermediate frequency variable-gain amplifier (IF VGA) 130, the signal is sent to a pair of intermediate-frequency mixers 141 and 142, which receive a second local oscillator signal with a 90-degree rotation therebetween, as will be discussed hereinafter with reference to 190. After passing through respective baseband amplifiers 151 and 152, in-phase component 161 and quadrature component 162 are output.

Local oscillator (LO) signals are generated using a voltage-controller oscillator (VCO) in phase locked loop (PLL) 170 controlled by reference clock 175 to operate at the RF frequency or twice the RF frequency to generate quadrature signals input to mixers 141 and 142 upon division by two by divider 190 and also to avoid injection pulling from power amplifiers 161 and 162. LO signal is used by mixer 120 to downconvert received signal 105 from radio frequency (RF) to an intermediate frequency (IF) or direct current (DC). LO source 170 operates at a lower frequency (preferably a sub-harmonic of the required LO frequency to down convert the RF signal) and is followed by frequency tripler 180.

Figure 2:
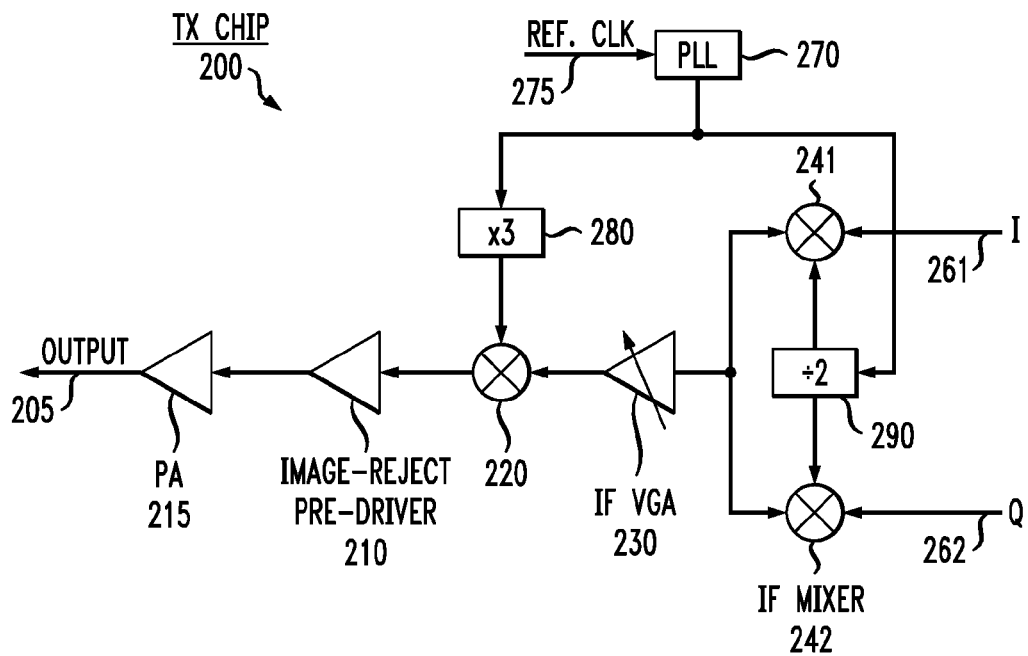
FIG. 2 shows a block diagram of a 60 GHz radio transmitter suitable for use with an illustrative embodiment of the present invention.

FIG. 2 is a block diagram of exemplary 60 GHz radio transmitter chip 200. In phase component 261 and quadrature component 262 are passed through respective intermediate-frequency mixers 241 and 242. The output from these mixers are then passed through intermediate-frequency variable-gain amplifier 230 and downconversion mixer 220, which receives a local oscillator signal from frequency tripler 280, to be discussed in further detail hereinafter. This signal is then sent through image-reject pre-driver 210 and power amplifier 215 to produce output signal 205.

LO signals are generated using a VCO in phase locked loop (PLL) 270 controlled by reference clock 275 to operate at the RF frequency or twice the RF frequency to generate quadrature signals input to mixers 241 and 242 upon division by two by divider 290 and also to avoid injection pulling from power amplifier 215. This LO signal is also used by mixer 220 to up-convert information at DC or IF to RF. LO source 270 operates at a lower frequency (preferably a sub-harmonic of the required LO frequency to up convert to an RF signal) and is followed by frequency tripler 280.

As described in B. Floyd et al., "A silicon 60 GHz receiver and transmitter chipset for broadband communications," *IEEE Intl. Solid-State Circuits Conference*, February 2006, pp: 649-658, the use of a frequency tripler for a 60 GHz millimeter wave super-heterodyne radio relaxes the design requirements of the radio in terms of the image rejection in the LNA, the frequency of operation of the IF baseband circuitry and the realization of a synthesizer based on a single VCO.

However, the aforementioned Floyd reference suggests the use of a frequency tripler based on a cascoded differential pair with tuned loads, as described in B. Floyd, et al., "SiGe bipolar transceiver circuits operating at 60 GHz," *IEEE Journal of Solid-State Circuits*, vol. 40, no. 1, pp: 156-167, January 2005, the disclosure of which is incorporated by reference herein. The functionality of this tripler relies on the generation of the third harmonic distortion in the differential pair and the rejection of the fundamental tone by the loads tuned at the tripled frequency. However, the rejection of the fundamental is dependent on the Q-component of the tuned load thereby implying that the load is not a proper short circuit to ground at all other frequencies other than the tripled frequency.

Figure 3:
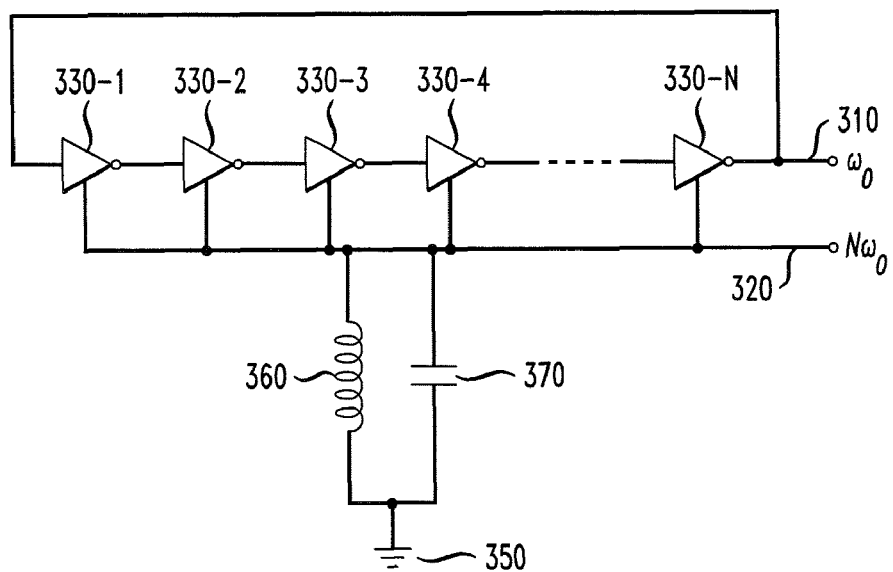
FIG. 3 shows a frequency multiplier according to the prior art.

FIG. 3 shows ring oscillator-based frequency multiplier 300 similar to that described in S. Verma, et al., "A multiply-by-3 coupled-ring oscillator for low-power frequency synthesis," *IEEE Journal of Solid-State Circuits*, vol. 39, no. 4, pp. 709-713, April 2004, the disclosure of which is incorporated by reference herein. Frequency multiplier 300 is based on ring oscillators for low power frequency synthesis and for low frequencies. Specifically, single-ended N-stage ring oscillator 300 running at frequency $\omega_0$ provides outputs 310 and 320. Output 310 is at frequency $\omega_0$ and output 320 is at multiplied frequency $N\omega_0$. This multiply-by-N oscillator uses N identical stages (delay elements), namely CMOS inverters 330-1, 330-2, 330-3, 330-4, . . . 330-N. The sources of these devices are coupled together and connected to ground 350 through an LC tank circuit, comprising inductor 360 and capacitor 370. By using an LC tank coupled to ground 350, additional harmonics are filtered out. More specifically, due to the phase relationship among the voltages and currents of the different stages of the ring oscillator, only harmonics of $N\omega_0$ appear at high-frequency output 320. Although this arrangement provides a convenient way of multiplying the output frequency of ring oscillator 300, ring oscillator 300 provides only limited output amplitude of roughly 10% of the supply voltage.

Figure 4:
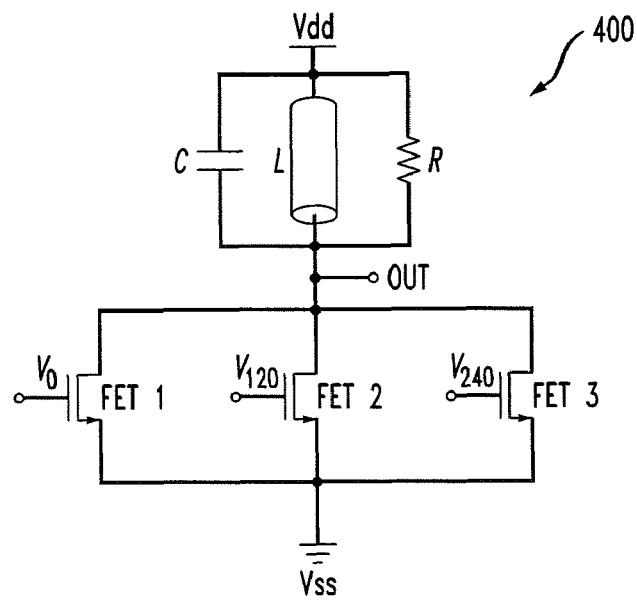
FIG. 4 shows an exemplary frequency tripler according to an aspect of the present invention.

FIG. 4 shows frequency tripler 400 according to an aspect of the present invention. Voltage source Vdd is connected to an RLC tank comprising capacitor C, inductor L and resistor R, connected in parallel. The source terminals of identical field effect transistors FET1, FET2 and FET3 are coupled and connected to ground Vss and the drain terminals are connected to output OUT.

Frequency tripler 400 is based on a multiphase input signal. Specifically, the gate terminals of FET1, FET2 and FET3 are connected to a three-stage ring oscillator (not shown) which produces three phases of an input signal at a particular frequency (e.g., local oscillator signal LO) that are of equal amplitude but are 120° apart. The gate terminal of FET1 receives signal $V_0$ having a phase of 0°; the gate terminal of FET2 receives signal $V_{120}$ having a phase of 120°; and the gate terminal of FET3 receives signal $V_{240}$ having a phase of 240°. Because FET1, FET2 and FET3 are identical and are driven by signals equal in amplitude but having phases 120° apart, each of transistors FET1, FET2 and FET3 conducts for one-third of the complete cycle which results in a conduction rate three times the input frequency. Thus, the effective voltage that develops at output OUT has a frequency that is three times the input signal frequency.

This operation eliminates all fundamental and even-order harmonics at the drain because the conduction characteristics in FET1, FET2 and FET3 are identical. This is because the combined action of FET1, FET2 and FET3 results in a short circuit to ground Vss at the drain node for the fundamental and any even-order harmonics. In other words, for the fundamental and even-order harmonic components of a given FET, the combined effect of the other two FETs provide a short circuit to ground Vss whereas for the third harmonic component each FET provides a high impedance and hence all the third harmonic component flows across load resistor R if the RLC tank is tuned to the tripled frequency.

Another advantage of this circuit is that, since the common drain terminal of FET1, FET2 and FET3 is AC ground for the fundamental frequency, the feedback effect of the gate drain capacitance of all the FETs, which could be significant at millimeter wave frequencies, is also eliminated. Moreover, because the three FETs which are connected to the LC tank circuit are separate from the oscillator and can be connected together at the drain, the output amplitude is not self limiting as with frequency tripler 300 in FIG. 3. In fact, the output amplitude can exceed the supply voltage.

Figure 5:
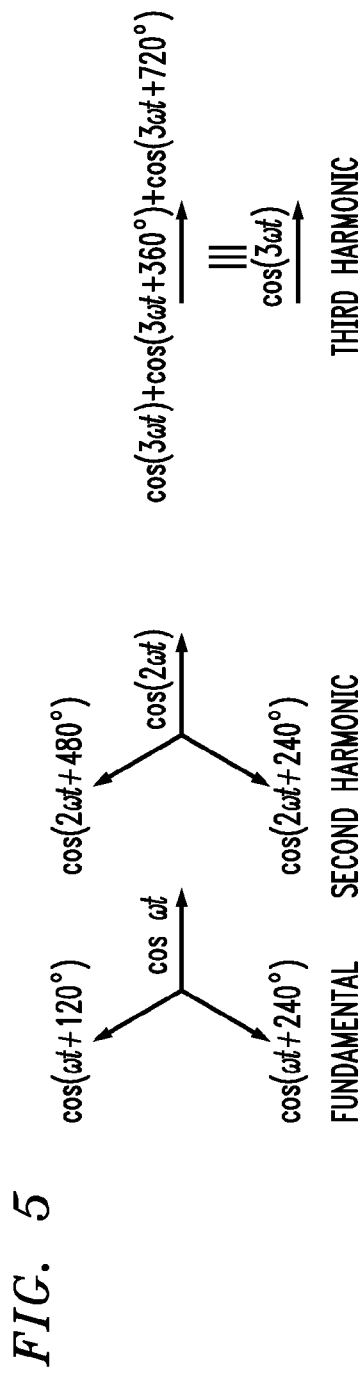
FIG. 5 shows phasor diagrams for current components in the frequency tripler shown in FIG. 4.

FIG. 5 shows a current phasor diagram representing the fundamental and the harmonic device currents associated with frequency tripler 400 shown in FIG. 4. Contrary to most other implementations of frequency triplers, frequency tripler 400 shown in FIG. 4 provides inherent rejection of the fundamental and even order harmonics and is not dependent on the load, thus providing higher input-to-output isolation.

Figure 6:
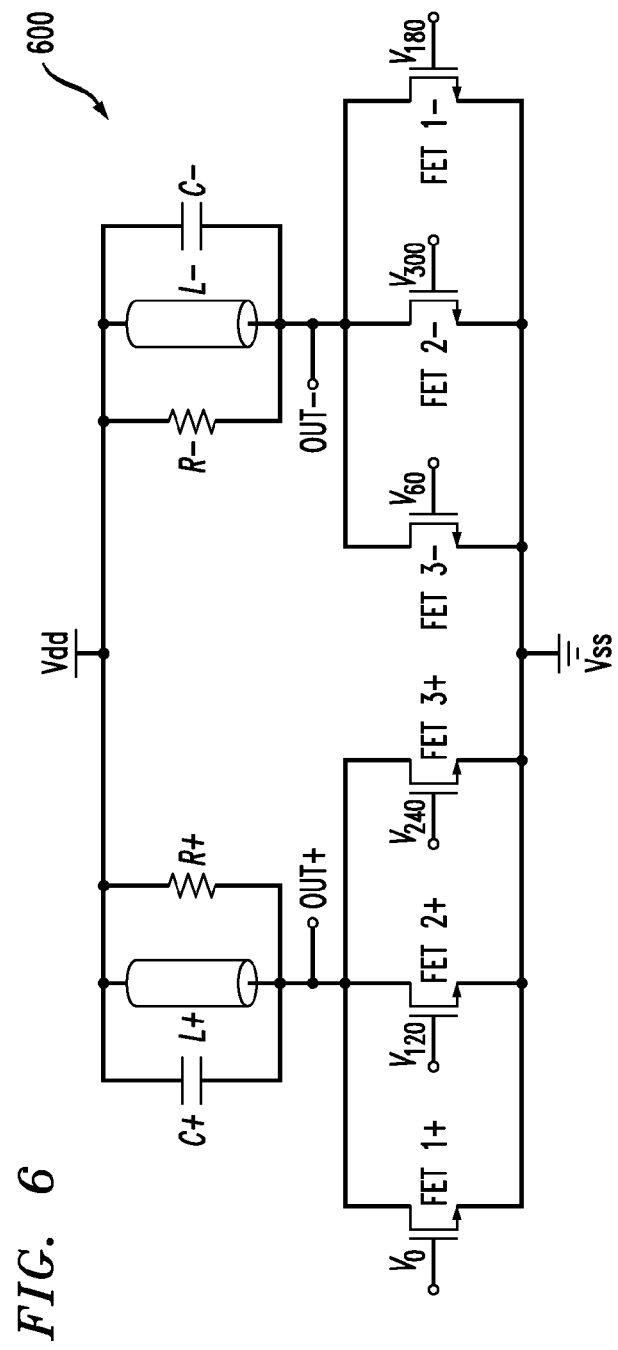
FIG. 6 shows an exemplary differential frequency tripler according to an aspect of the present invention.

FIG. 6 shows differential frequency tripler 600 according to an aspect of the present invention. Voltage source Vdd is connected to a pair of RLC tanks. An end of each RLC tank opposite voltage source Vdd is connected to the coupled drains of set of three FETs, as well as to output. The drains of a first set of FETs, comprising FET1+, FET2+ and FET3+, are connected to output signal Out+ and then to an RLC tank comprising capacitor C+, inductor L+ and resistor R+ connected in parallel. The drains of a second set of FETs, comprising FET1−, FET2− and FET3−, are connected to output signal Out− and then to an RLC tank comprising capacitor C−, inductor L− and resistor R− connected in parallel. The source terminals of field effect transistors FET1+, FET2+, FET3+, FET1−, FET2− and FET3− are coupled and connected to ground Vss.

Frequency tripler 600 produces a differential version of the tripled signal by using six phases from a ring oscillator or other voltage-controlled oscillator (VCO), such as oscillator 700 to be described hereinafter with reference to FIG. 7. In an illustrative embodiment, the design of the VCO may be relaxed, thereby lowering its operating frequency, and the differential signals from a VCO may be used directly without the need of a transformer or balun.

In frequency tripler 600, the gate terminal of FET1+ receives signal $V_0$ with a phase of 0°; the gate terminal of FET2+ receives signal $V_{120}$ with a phase of 120°; and the gate terminal of FET3+ receives signal $V_{240}$ with a phase of 240°. The gate terminal of FET1− receives signal $V_{60}$ with a phase of 60°; the gate terminal of FET2− receives signal $V_{300}$ with a phase of 300°; and the gate terminal of FET3− receives signal $V_{180}$ with a phase of 180°.

Thus, one set of three FETs receives signals having phases which are anti-phase to the phases of the signals feeding the other set of three FETs. The differential operation of the circuits involved produces a differential output comprising output signals OUT+ and OUT−, each at a frequency of thrice the local oscillator frequency (3×LO), which advantageously drives a mixer with balanced LO input, as opposed to single-ended frequency tripler 400 in FIG. 4.

Figure 7:
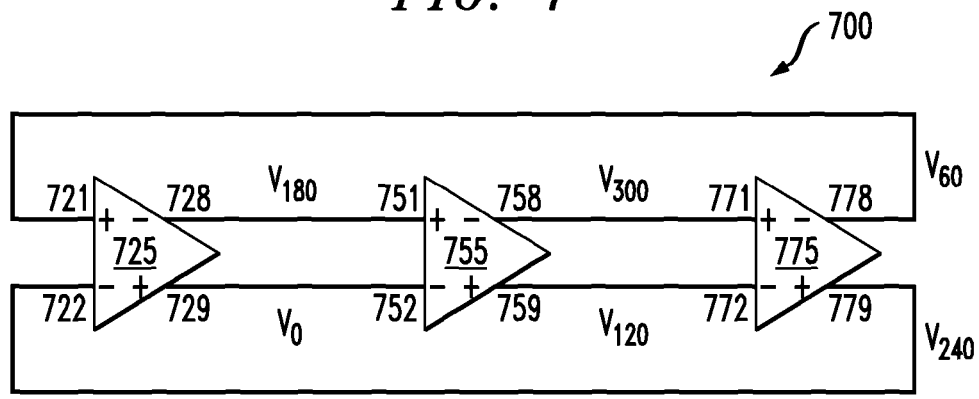
FIG. 7 shows an exemplary differential multiphase ring oscillator suitable for use with the differential frequency tripler shown in FIG. 6 according to an aspect of the present invention.

FIG. 7 shows exemplary VCO 700 suitable for use with differential frequency tripler 600 in FIG. 6. VCO 700 comprises three inverters 725, 755 and 775 connected in series, each inverter having a positive input, negative input, negative output and positive input. Negative output 728 of inverter 725 is connected to positive input 751 of inverter 755, and positive output 729 of inverter 725 is connected to negative input 752 of inverter 755. Negative output 758 of inverter 755 is connected to positive input 771 of inverter 775, and positive output 759 of inverter 755 is connected to negative input 772 of inverter 775. Negative output 778 of inverter 775 is connected to positive input 721 of inverter 725, and positive output 779 of inverter 775 is connected to negative input 722 of inverter 725.

Inverter 725 receives signal $V_{60}$ with a phase of 60° at positive input 721 and receives signal $V_{240}$ with a phase of 240° at negative input 722, then transmits signal $V_{180}$ with a phase of 180° at negative output 728 and transmits signal $V_0$ with a phase of 0° at positive output 729. Inverter 755 receives signal $V_{180}$ with a phase of 180° at positive input 751 and receives signal $V_0$ with a phase of 0° at negative input 752, then transmits signal $V_{300}$ with a phase of 300° at negative output 758 and transmits signal $V_{120}$ with a phase of 120° at positive output 759. Inverter 775 receives signal $V_{300}$ with a phase of 300° at positive input 771 and receives signal $V_{120}$ with a phase of 120° at negative input 772, then transmits signal $V_{60}$ with a phase of 60° at negative output 778 and transmits signal $V_{240}$ with a phase of 240° at positive output 779.

The techniques heretofore described are not restricted to frequency tripling, but can instead be used to generate Nth-order harmonics, where N is any integer greater than one, and the relative signal phases are 360°/N.

Figure 8:
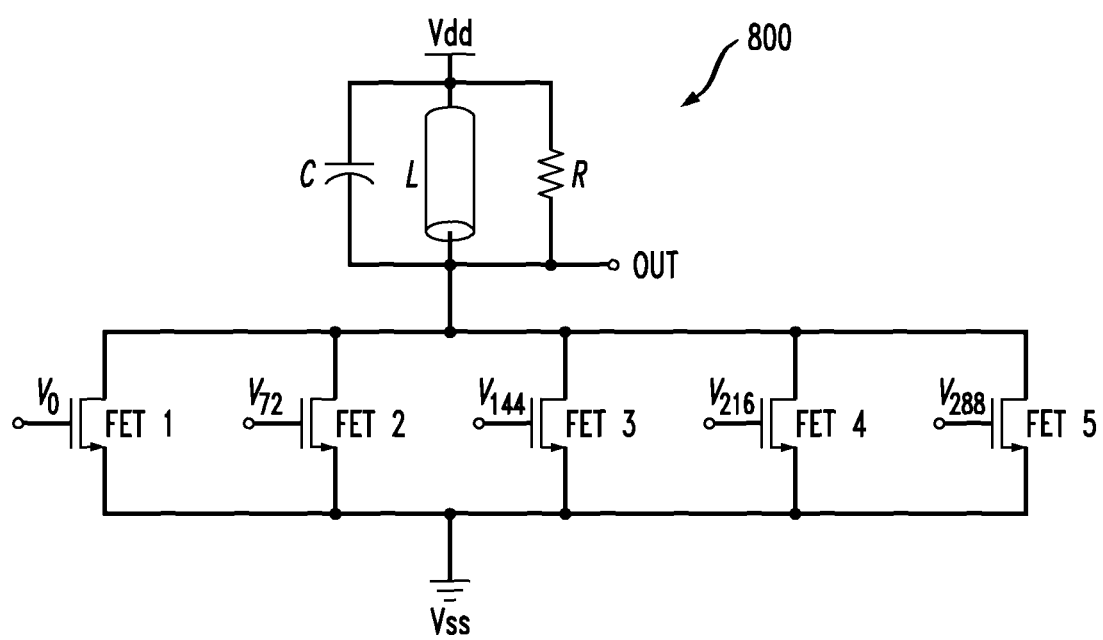
FIG. 8 shows an exemplary frequency quintupler according to an aspect of the present invention.

FIG. 8 shows a frequency quintupler according to the present invention. As with frequency tripler 400 shown in FIG. 4, voltage source Vdd is connected to an RLC tank comprising capacitor C, inductor L and resistor R, connected in parallel. The source terminals of identical field effect transistors FET1, FET2, FET3, FET4 and FET5 are coupled and connected to ground Vss and the drain terminals are connected to output OUT.

The gate terminals of FET1, FET2, FET3, FET4 and FET5 are connected to a five-stage ring oscillator (not shown) which produces five phases of an input signal at a particular fundamental frequency (e.g., local oscillator signal LO) that are of equal amplitude but are have phases that are 72° apart, instead of 120° as in frequency tripler 400 shown in FIG. 4. The gate terminal of FET1 receives signal $V_0$ with a phase of 0°; the gate terminal of FET2 receives signal $V_{72}$ with a phase of 72°; the gate terminal of FET3 receives signal $V_{144}$ with a phase of 144°; the gate terminal of FET4 receives signal $V_{216}$ with a phase of 216° and the gate terminal of FET5 receives signal $V_{288}$ having a phase of 288°.

Because FET1, FET2, FET3, FET4 and FET5 are identical and are driven by signals equal in amplitude but having phases 72° apart, each of transistors FET1, FET2, FET3, FET4 and FET5 conducts for one-fifth of the complete cycle which results in a conduction rate five times the input frequency. Thus, the effective voltage that develops at output OUT has a frequency that is five times the input signal frequency.

This operation eliminates all fundamental and lower-order harmonics at the drain because the conduction characteristics in FET1, FET2, FET3, FET4 and FET5 are identical. This is because the combined action of FET1, FET2, FET3, FET4 and FET5 results in a short circuit to ground Vss at the drain node for the fundamental and any lower-order harmonics. In other words, for the fundamental and the lower-order harmonic components of a given FET, the combined effect of the other four FETs provide a short circuit to ground Vss whereas for the fifth harmonic component each FET provides a high impedance and hence all the fifth harmonic component flows across load resistor R if the RLC tank is tuned to the fifth frequency.

Figure 9:
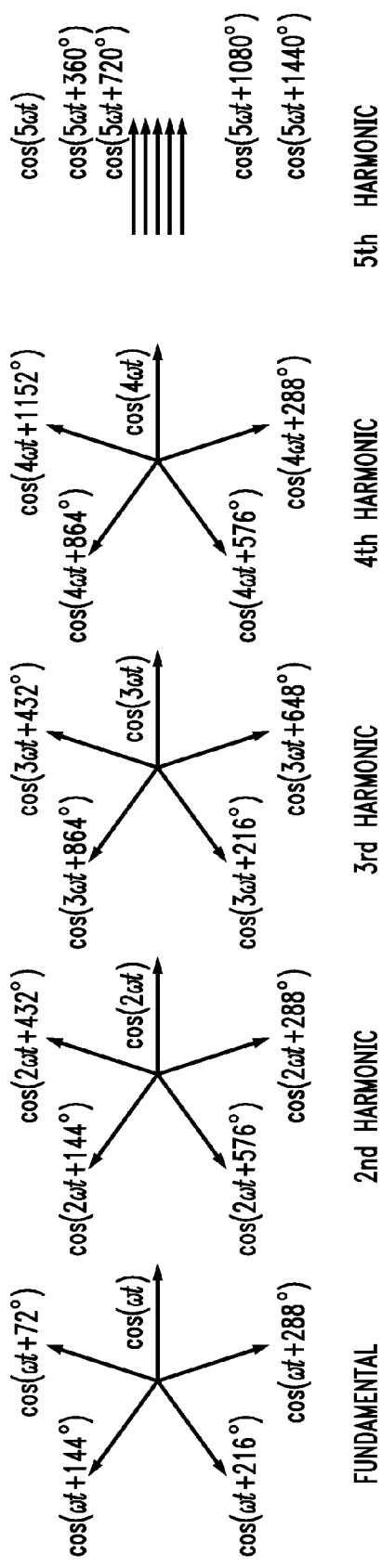
FIG. 9 shows phasor diagrams for current components in the frequency quintupler shown in FIG. 8.

FIG. 9 shows a FET current phasor diagram, representing the fundamental and second, third, fourth and fifth harmonic device currents associated with frequency quintupler 800 in FIG. 8. It can be seen from the diagram that the device currents for the fundamental and second, third and fourth harmonic currents each add to zero, while the fifth harmonic device currents add constructively.

In a preferred embodiment, the structures shown in FIGS. 4 and 6-8 may be implemented using CMOS 10SF technology (commercially available from International Business Machines of Armonk, N.Y.) with a channel length of 50 nm.

At least a portion of the circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Figure 10:
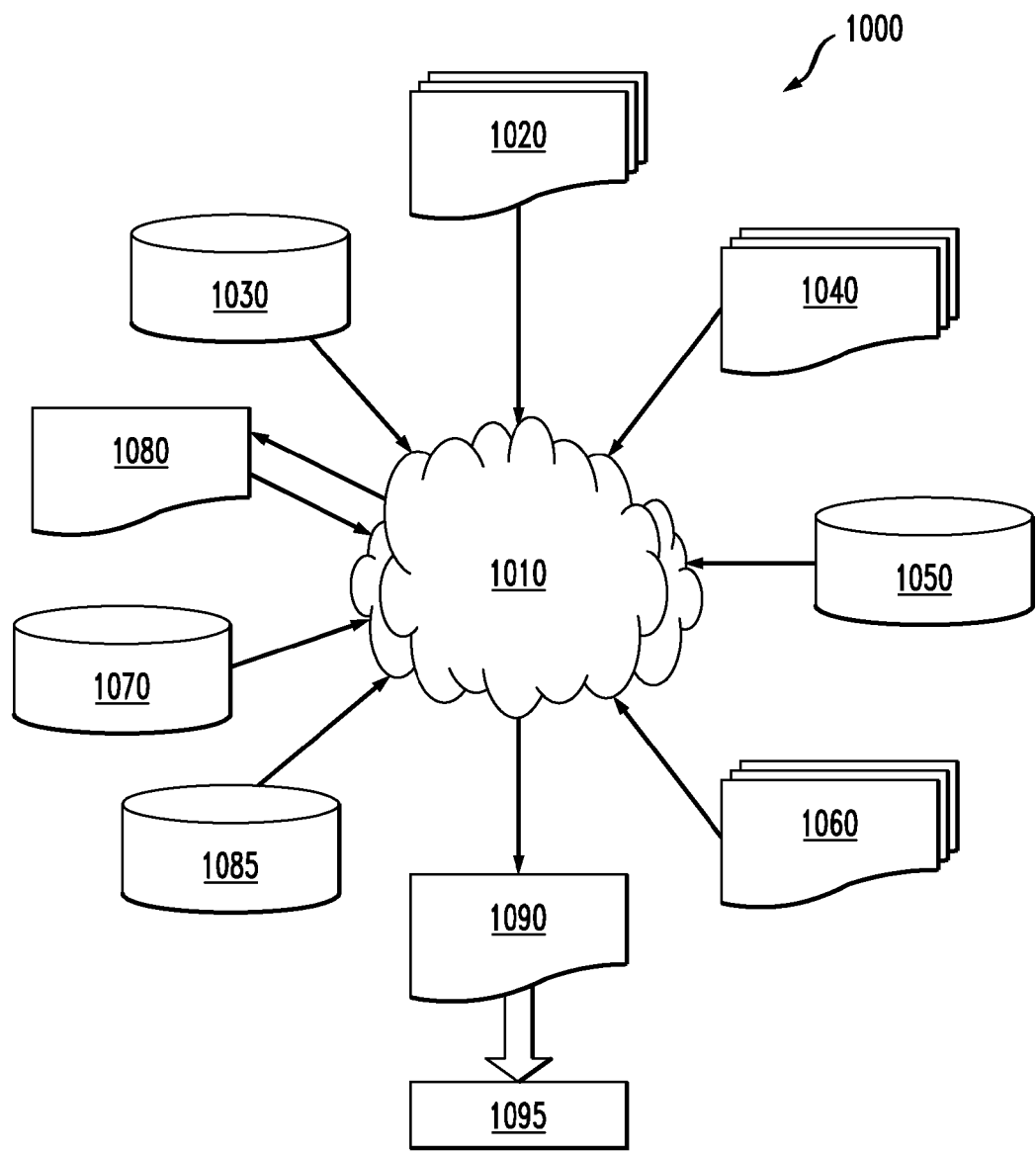
FIG. 10 is a flow diagram of a design process used in semiconductor design, manufacture, and/or test.

FIG. 10 shows a block diagram of an exemplary design flow 1000 used for example, in semiconductor design, manufacturing, and/or test. Design flow 1000 may vary depending on the type of integrated circuit (IC) being designed. For example, a design flow 1000 for building an application specific IC (ASIC) may differ from a design flow 1000 for designing a standard component. Design structure 1020 is preferably an input to a design process 1010 and may come from an IC provider, a core developer, or other design company or may be generated by the operator of the design flow, or from other sources. Design structure 1020 may comprise an embodiment of the invention as shown in FIG. 4 or 6-8 in the form of schematics or HDL, a hardware-description language (e.g., Verilog, VHDL, C, etc.). Design structure 1020 may be contained on one or more machine readable medium. For example, design structure 1020 may be a text file or a graphical representation of an embodiment of the invention as shown in FIG. 4 or 6-8. Design process 1010 preferably synthesizes (or translates) an embodiment of the invention as shown in FIG. 4 or 6-8 into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention as shown in FIG. 4 or 6-8, along with any additional integrated circuit design or data (if applicable), into a second design structure 1090. Design structure 1090 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1090 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 4 or 6-8. Design structure 1090 may then proceed to a stage 1095 where, for example, design structure 1090: proceeds to tape-out, is released to manufacturing, is released to a mask house, is sent to another design house, is sent back to the customer, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of generating a differential output from an input signal, comprising the steps of:

generating a first set of n signals, n being an integer greater than or equal to 3, by generating a signal for each integer i such that $0 \leq i \leq (n-1)$, each signal within the first set of signals having the same frequency and approximately equal amplitude and a phase equal to $(360/n)i$ degrees;

inputting each of the first set of n signals to a gate terminal of a corresponding one of a first set of n transistors, each of the transistors within the first set of transistors having a source terminal electrically connected to a common voltage drain and each of the transistors within the first set of transistors having a drain terminal electrically connected to a first coupling, the first coupling being electrically connected to a common voltage source;

generating a second set of n signals by generating a signal for each integer j such that $0 \leq j \leq (n-1)$, each signal within the second set of signals having the same frequency and approximately equal amplitude and a phase equal to $(360/n)j+(360/2n)$ degrees;

inputting each of the second set of n signals to a gate terminal of a corresponding one of a second set of n transistors, each of the transistors within the second set of transistors having a source terminal electrically connected to the common voltage drain and each of the transistors within the second set of transistors having a drain terminal electrically connected to a second coupling, the second coupling being electrically connected to the common voltage source;

such that the respective differential output signals at the first and second couplings each have a frequency equal to the frequency of the input signal multiplied by n.

2. The method of claim 1, wherein the first coupling and the common voltage source are electrically connected to respective ends of a first parallel RLC tank circuit and wherein the second coupling and the common voltage source are electrically connected to respective ends of a second parallel RLC tank circuit.

3. The method of claim 1, wherein the first and second sets of n signals are generated by a voltage-controlled oscillator having n stages.

4. A method of generating an output signal from an input signal, comprising the steps of:

generating a set of n signals, n being an integer greater than or equal to 3, by generating a signal for each integer i such that $0 \leq i \leq (n-1)$, each signal within the set having the same frequency and approximately equal amplitude and a phase equal to $(360/n)i$ degrees; and inputting each of the set of n signals to a gate terminal of a corresponding one of a set of n transistors, each of the transistors having a source terminal electrically connected to a common voltage drain and each of the transistors having a drain terminal electrically connected to a coupling, the coupling electrically connected to a common voltage source;

such that the output signal at the coupling has a frequency equal to the frequency of the input signal multiplied by n.

5. The method of claim 4, wherein the coupling and the common voltage source are electrically connected to respective ends of a parallel RLC tank circuit.

6. The method of claim 4, wherein the set of n signals is generated by a voltage-controlled oscillator.

7. The method of claim 6, wherein the voltage-controlled oscillator has n stages.

8. A frequency multiplier comprising:

a first set of n transistors, where n is an integer such that $n \geq 3$;

a first coupling electrically connected to a drain terminal of each of the at least first set of transistors;

a voltage source electrically connected to the first coupling; and a voltage drain electrically connected to a source terminal of each of the first set of transistors;

wherein respective gate terminals of the first set of n transistors are operative to receive corresponding ones of a first set of n signals having a given frequency and a given amplitude but with phases separated by $360/n$ degrees, thereby producing a signal at the at least first coupling with a frequency equal to the common frequency multiplied by n.

9. The frequency multiplier of claim 8, further comprising a parallel RLC tank circuit, opposite ends of which are electrically connected to the first coupling and the common voltage source.

10. The frequency multiplier of claim 8, further comprising a voltage-controlled oscillator operative to generate the first set of n signals.

11. The frequency multiplier of claim 8, wherein the voltage-controlled oscillator comprises n stages.

12. The frequency multiplier of claim 8, further comprising:

a second set of n transistors, each transistor having a source terminal electrically connected to the voltage drain; and a second coupling electrically connected to the voltage source and to a drain terminal of each of the at least first set of transistors;

wherein respective gate terminals of the second set of n transistors are operative to receive corresponding ones of a second set of n signals having the given frequency and the given amplitude but with phases separated by $360/n$ degrees, thereby producing a signal at the second coupling with a frequency equal to the given frequency multiplied by n.

13. The frequency multiplier of claim 12, wherein the signal at the first coupling and the signal at the second coupling are differential signals of opposite phases.

14. The frequency multiplier of claim 12, wherein respective ones of the first set of n signals and of the second of n signals have phases separated by $360/2n$ degrees.

15. The frequency multiplier of claim 12, further comprising a first parallel RLC tank circuit electrically connected to the first coupling and to the voltage source, and a second parallel RLC tank circuit electrically connected to the second coupling and the voltage source.

16. The frequency multiplier of claim 12, further comprising a voltage-controlled oscillator operative to generate the first and second sets of n signals.

17. The frequency multiplier of claim 16, wherein the voltage-controlled oscillator comprises n stages.

18. A design structure embodied in a machine readable storage medium, the design structure comprising the frequency multiplier of claim 8.

19. The design structure of claim 18, wherein the frequency multiplier further comprises:

a second set of n transistors, each transistor having a source terminal electrically connected to the voltage drain; and a second coupling electrically connected to the voltage source and to a drain terminal of each of the at least first set of transistors;

wherein respective gate terminals of the second set of n transistors are operative to receive corresponding ones of a second set of n signals having the given frequency and the given amplitude but with phases separated by 360/n degrees, thereby producing a signal at the second coupling with a frequency equal to the given frequency multiplied by n.

20. The design structure of claim 19, wherein respective ones of the first set of n signals and of the second set of n signals have phases separated by 360/(2n) degrees, such that the signal at the first coupling and the signal at the second coupling are differential signals of opposite phases.

* * * * *